United States Patent [19]
Fujii et al.

[11] Patent Number: 5,776,822
[45] Date of Patent: Jul. 7, 1998

[54] METHOD FOR FABRICATING SEMICONDUCTOR DEVICE HAVING TITANIUM SILICIDE FILM

[75] Inventors: Kunihiro Fujii; Hiroshi Ito, both of Tokyo, Japan

[73] Assignee: NEC Corporation, Tokyo, Japan

[21] Appl. No.: 785,279

[22] Filed: Jan. 23, 1997

Related U.S. Application Data

[63] Continuation of Ser. No. 582,343, Jan. 19, 1996, abandoned.

[30] Foreign Application Priority Data

Jan. 30, 1995 [JP] Japan ................................. 7-013149

[51] Int. Cl.[6] .................................................. H01L 21/28
[52] U.S. Cl. ...................... 438/586; 438/592; 438/655; 438/656; 438/664; 438/755
[58] Field of Search ................................. 438/664, 655, 438/656, 755, 586, 592

[56] References Cited

U.S. PATENT DOCUMENTS

| | | |
|---|---|---|
| 4,701,349 | 10/1987 | Koyanagi et al. ................... 438/664 |
| 4,788,160 | 11/1988 | Havemann et al. ................... 437/200 |
| 4,923,822 | 5/1990 | Wang et al. ........................... 437/200 |
| 5,023,201 | 6/1991 | Stanasolovich ...................... 437/200 |
| 5,043,300 | 8/1991 | Nulman .............................. 437/200 |

FOREIGN PATENT DOCUMENTS 4-34933  2/1992  Japan.

OTHER PUBLICATIONS

Krooshof, G.J.P. et al., Study of the rapid thermal nitridation and silicidation of Ti using elastic recoil detection.II.Ti on $SiO_2$. *Journal of Applied Physics*, vol. 63, No. 10, May 15, 1988, pp. 5110–5114.

*Primary Examiner*—John Niebling
*Assistant Examiner*—Thomas G. Bilodeau
*Attorney, Agent, or Firm*—Young & Thompson

[57] ABSTRACT

In a method for producing a semiconductor device disclosed herein, a titanium film (131) is formed on a silicon layer and a titanium disilicide film (134) of a C49 structure is formed by the first rapid thermal annealing, followed by removing a titanium nitride film (132). The titanium disilicide film (134) thus formed is then subjected to phase transition to form titanium disilicide film (135a) of a C54 structure, and the titanium-excess titanium silicide film (133) is selectively removed by the second wet etching.

21 Claims, 7 Drawing Sheets

METHOD FOR FABRICATING SEMICONDUCTOR DEVICE HAVING TITANIUM SILICIDE FILM

This application is a continuation of application Ser. No. 08/582,343, filed Jan. 19, 1996, now abandoned.

BACKGROUND OF THE INVENTION

1. Field of the Invention

The present invention relates to a method for producing a semiconductor device, and more specifically, to a method for producing a MOS transistor having a self-aligned silicide structure.

2. Description of the Prior Art

Titanium has been used for producing conventional MOS transistors having a self-aligned silicide structure. This is because a titanium disilicide (TiSi$_2$) film (especially a titanium disilicide film of the C54 structure) has lower electrical resistivity than other silicide films.

Referring now to FIGS. 8(a) to 8(d), which are sectional views illustrating respective steps according to a method of producing a conventional CMOS transistor having a self-aligned silicide structure using titanium, an N-type well 202 is formed in a predetermined region on the surface of a P-type silicon substrate 201, a field oxide film 203 is formed in the element separating region on the surface of the P-type silicon substrate 201 by selective oxidation, and a gate oxide film 204 is formed in the element forming region on the surface of the P-type silicon substrate 201. A poly-crystal silicon film is deposited on the entire surface, and phosphorus is doped to form an N$^+$-type poly-crystal silicon film. This N$^+$-type poly-crystal silicon film is patterned to form N$^+$-type poly-crystal silicon film patterns 215a and 215b in regions where the gate electrodes of an N-channel MOS transistor and a P-channel MOS transistor will be formed, respectively. By the ion implantation of an N-type impurity using a photoresist film (not shown) covering the region where the P-channel MOS transistor will be formed and the N$^+$-type poly-crystal silicon film pattern 215a as masks, and the ion implantation of a P-type impurity using the N$^+$-type poly-crystal silicon film pattern 215b as a mask, an N$^-$-type diffusion layer 217 and a P$^-$-type diffusion layer 218 are formed. An insulating film consisting, for example, of silicon oxide is deposited on the entire surface. This insulating film is etched back by anisotropic dry etching to form a side-wall spacer 206 consisting of this insulating film on the side walls of the N$^+$-type poly-crystal silicon film patterns 215a and 215b [FIG. 8(a)].

Next, an N$^+$-type diffusion layer 227 and a P$^+$-type diffusion layer 228 are formed by the ion implantation of an N-type impurity using a photoresist film (not shown) covering the region where a P-channel MOS transistor will be formed, the N$^+$-type poly-crystal silicon film pattern 215a, and the side-wall spacer 206 as masks, the ion implantation of a P-type impurity using a photoresist film (not shown) covering the region where an N-channel MOS transistor will be formed, the N -type poly-crystal silicon film pattern 215b, and the side-wall spacer 206 as masks, and inactivating treatment. The naturally oxidized films on the upper surfaces of N$^+$-type poly-crystal silicon film patterns 215a and 215b, and on the surfaces of the N$^+$-type diffusion layer 227 and a P$^+$-type diffusion layer 228 are removed by wet etching. A titanium film 231 is deposited on the entire surface by spattering [FIG. 8(b)].

Next, the first rapid thermal annealing (RTA) is performed in a nitrogen atmosphere at 700° C. or below to silicify the titanium film 231 directly contacting monocrystalline or poly-crystal silicon, and to form a titanium disilicide film 234 of a C49 structure selectively on the upper surfaces of N$^+$-type poly-crystal silicon film patterns 215a and 215b, and on the surfaces of the N$^+$-type diffusion layer 227 and a P$^+$-type diffusion layer 228. The titanium film 231 which has covered the surfaces of the field oxide film 203 and the side-wall spacer 206 is converted to a titanium nitride film 232. Depending on the as-formed thickness of the titanium film 231 and the conditions of the first rapid thermal annealing, the surface of the titanium disilicide film 234 is also covered with the titanium nitride film 232 [FIG. 8(c)].

Next, the titanium nitride film 232 is removed by wet etching using, for example, a mixed solution of ammonia water (NH$_4$OH) and hydrogen peroxide (H$_2$O$_2$). The second rapid thermal annealing is performed at a temperature higher than the temperature of the first rapid thermal annealing to convert the titanium disilicide film 234 of a C49 structure, on the upper surfaces of N$^+$-type poly-crystal silicon film patterns 215a and 215b, and on the surfaces of the N$^+$-type diffusion layer 227 and a P$^+$-type diffusion layer 228, to titanium disilicide films 235a and 235b, and titanium disilicide films 237 and 238 of a C54 structure, respectively (phase transition). By this a CMOS transistor of a self-aligned silicide structure is formed. The N-channel MOS transistor constituting this CMOS transistor (of a self-aligned silicide structure) has a gate electrode 205a consisting of the N$^+$-type poly-crystal silicon film pattern 215a and the titanium disilicide film 235a, and a source/drain region 207 consisting of the N$^-$-type diffusion layer 217, the N$^+$-type diffusion layer 227, and the titanium disilicide film 237. The P-channel MOS transistor constituting this CMOS transistor (of a self-aligned silicide structure) has a gate electrode 205b consisting of the N$^+$-type poly-crystal silicon film pattern 215b and the titanium disilicide film 235b, and a source/drain region 208 consisting of the P$^-$-type diffusion layer 218, the P$^+$-type diffusion layer 228, and the titanium disilicide film 238 [FIG. 8(d)].

The reason that the titanium film is not converted to the titanium disilicide film of a C54 structure in one silicifying reaction, but the reaction is performed in two steps is to avoid the phenomena described below caused by a rapid silicifying reaction. In the rapid silicifying reaction for forming a titanium disilicide film of a C54 structure in one silicifying reaction, a titanium disilicide film is locally grown on the surface of the side-wall spacer (bridging), increasing a leakage current or short-circuiting between the gate electrode and the source/drain region. Also, the titanium disilicide film constituting the surface of the gate electrode becomes easy to coagulate, causing the sheet resistance of the gate electrode to tend to increase.

According to an article in Journal of Applied Physics, Vol. 63, No. 10, pp. 5110-5114 (1988), when a titanium disilicide film is formed on the upper surface of an N$^+$-type poly-crystal silicon film pattern and the surface of a high-concentration diffusion layer by heat treatment after forming a blanket titanium film has been formed on the entire surface, a thin titanium-excess titanium silicide (Ti$_5$Si$_3$) film is formed also on the surface of the field oxide film and the surface of the side-wall spacer. Unless such a titanium-excess titanium silicide has finally been removed, a leakage current or short-circuiting between the gate electrode and the source/drain region is easy to occur.

A method for solving this problem is disclosed in Japanese Patent Application Laid-Open No. 4-34933. According to this method, a titanium disilicide (TiSi$_2$) film of a C49 structure is selectively formed on the upper surface of an N⁺-type poly-crystal silicon film pattern and the surface of a high-concentration diffusion layer by heat treatment after forming a blanket titanium film has been formed on the entire surface, then only titanium and titanium nitride (TiN) films are removed using the first etchant having a high selectivity which removes titanium and titanium nitride films prior to titanium disilicide (and titanium-excess titanium silicide) films. Then, (titanium excess) titanium silicide films formed on the surfaces of the field oxide film and the side-wall spacer is removed using the second etchant, such as a mixed solution of ammonia water and hydrogen peroxide, having selectivity lower than the selectivity of the first etchant. For example, when the second etchant has the composition of $NH_4OH:H_2O_2:H_2O=1:1:5$, the titanium silicide films are removed by immersion in the second etchant for 30 seconds to 2 minutes, and problems such as electrical leakage are solved.

The inventors of the present invention examined the possibility of applying the method disclosed in the above patent to the method shown in FIG. 8. The thickness of the gate oxide film 204 was 10 nm, the thickness and the width on the gate oxide film 204 (gate length) of N⁺-type poly-crystal silicon film patterns 215a and 215b were 200 nm and 0.35 μm, respectively, the width of the side-wall spacer 206 was 150 nm, and the depth of the junction of the N⁺-type diffusion layer 227 and a P⁺-type diffusion layer 228 was 0.2 μm. A titanium film 231 of a thickness of 35 nm was spattered, and subjected to the first rapid thermal annealing in a nitrogen atmosphere at 690° C. for 30 seconds. The thickness of the titanium disilicide film 234 of a C49 structure became about 50 nm. Then the substrate was immersed in an etchant having the composition of $NH_4OH:H_2O_2:H_2O=1:1:5$ at room temperature changing time. The second rapid thermal annealing was performed in a nitrogen atmosphere at 850° C. for 10 seconds to effect the phase transition of the titanium disilicide film 234 to the titanium disilicide film 237 of a C54 structure.

A plurality of N-channel MOS transistors formed so that the total gate width became 25 cm were connected in parallel, and leakage current between the gate electrode 205 and the source/drain region 207 was measured. Although the above patent taught that etching for 3 minutes using the mixed solution of ammonia water and hydrogen peroxide of the above composition was sufficient, as FIG. 9 (the histogram of leakage current between the gate electrode 205 and the source/drain region 207) shows, the inventors of the present invention found that leakage current between the gate electrode 205 and the source/drain region 207 increased (and fluctuated) even after etching for 20 minutes, and that etching for 30 minutes or longer was required for restricting increase in leakage current. However, if etching is performed for a long time such as 30 minutes, the thickness of the titanium disilicide 234 decreases by about 6 nm, resulting in increase in the sheet resistance of the gate electrode 205 and the source/drain region 207. In particular in fine wiring such as in the gate electrode, increase in resistance will directly cause the operation speed of the circuit to lower. In conclusion, even if the prior art method is used, there is a trade-off relationship between increase in leakage current between the gate electrode and the source/drain region, and increase in the sheet resistance of the gate electrode (and the source/drain region).

BRIEF SUMMARY OF THE INVENTION

Therefore, it is an object of the present invention to provide a method for producing a MOS transistor having a self-aligned silicide structure using titanium, wherein increase in leakage current between the gate electrode and the source/drain region, and increase in the sheet resistance of the gate electrode (and the source/drain region) are simultaneously controlled.

A method according to the present invention comprises the steps of forming a field oxide film in the element separating region on the surface of a silicon substrate having a region of one conductivity type in at least a predetermined region, forming a gate oxide film in the element forming region on the surface of the silicon substrate, forming a poly-crystal silicon film pattern of a high concentration and a desired conductivity type in the region on the surface of the silicon substrate where a gate electrode is formed, forming a side-wall spacer consisting of an insulating film on the side wall of the poly-crystal silicon film pattern, forming a diffusion layer of a high concentration and the opposite conductivity type self-aligned with the side-wall spacer on the surface of the region of one conductivity type; forming a titanium film over the entire surface, a titanium disilicide film of the C49 structure selectively on the upper surface of the poly-crystal silicon pattern and the surface of the diffusion layer of the opposite conductivity type by the first rapid heat treatment in a nitrogen atmosphere, selectively removing the titanium nitride film by first wet etching, converting the titanium disilicide film of the C49 structure to a titanium disilicide film of the C54 structure by the second rapid heat treatment, and removing the titanium silicide film formed on the surface of the field oxide film and the surface of the side-wall spacer by second wet etching.

Preferably, the first wet etching is performed by a mixed solution of ammonia water and hydrogen peroxide, or a mixed solution of sulfuric acid and hydrogen peroxide, and the second wet etching is performed by a mixed solution of ammonia water and hydrogen peroxide.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
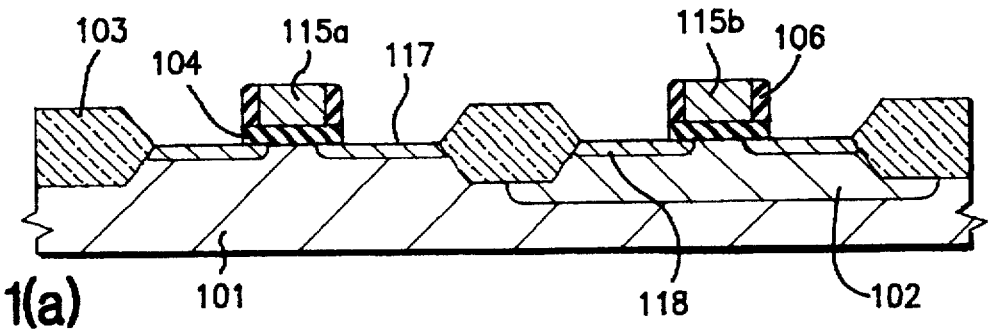
FIGS. 1(a) to 1(e) are sectional views showing steps for producing the first embodiment of the present invention.
Figure 1B:
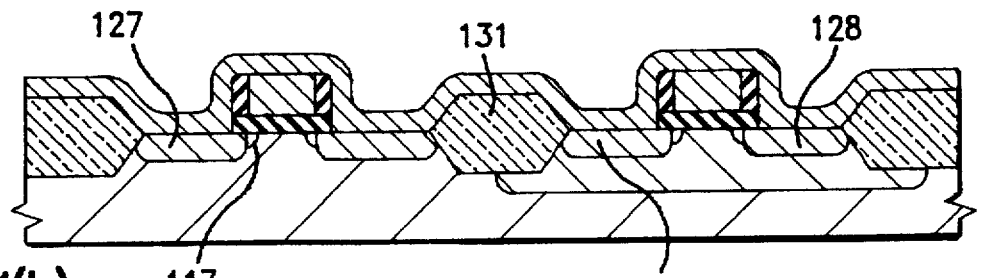
Figure 1C:
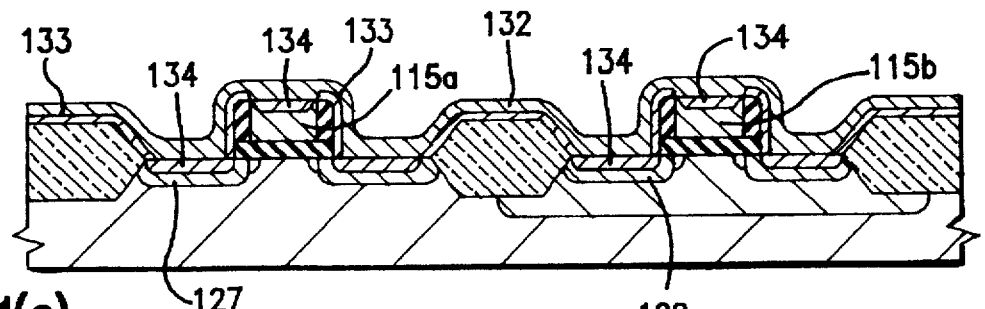
Figure 1D:
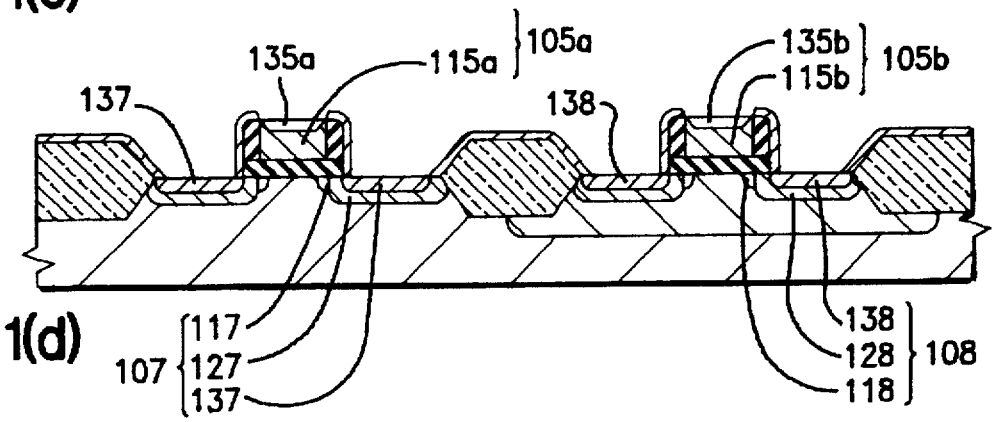
Figure 1E:
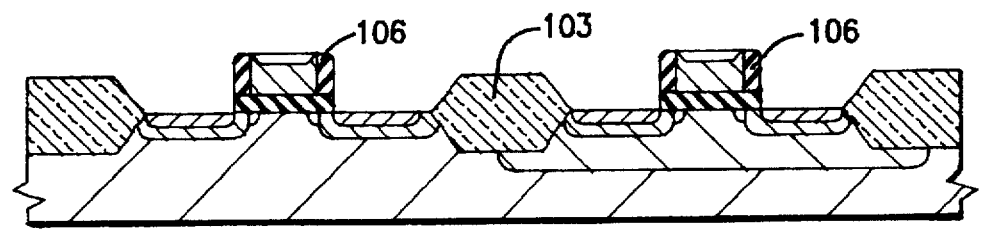

Referring now to FIG. 1, as a preferred embodiment of the present invention, the description will be made below on the method for producing a CMOS transistor having a self-aligned silicide structure using titanium.

An N-type well 102 is formed in the predetermined region on the surface of a P-type silicon substrate 101, a field oxide film 103 of a thickness of about 500 nm is formed in the eleformed in the element separating region on the surface of the P-type silicon substrate 101 by the selective oxidation method, and a gate oxide film 104 of a thickness of about 10 nm is formed in the element forming region on the surface of the P-type silicon substrate 101 by the thermal oxidation method. A poly-crystal silicon film of a thickness of about 200 nm is deposited on the entire surface by the CVD method, and phosphorus is doped to form an $N^+$-type poly-crystal silicon film. This $N^+$type poly-crystal silicon film is patterned to form $N^+$-type poly-crystal silicon film patterns 115a and 115b in regions where the gate electrodes of an N-chaynel MOS transistor and P-channel MOS transistor will be formed, respectively. By the ion implantation of an N-type impurity using a photoresist film (not shown) covering the region where the P-channel MOS transistor will be formed and the $N^+$-type poly-crystal silicon film pattern 115a as masks, and the ion implantation of a P-type impurity using a photoresist film (not shown) covering the region where N-channel MOS transistor will be formed and the $N^+$-type poly-crystal silicon film pattern 115b as masks, an $N^-$-type diffusion layer 117 and a $P^-$-type diffusion layer 118 are formed. An insulating film consisting, for example, of silicon oxide having a thickness of about 150 nm is deposited on the entire surface by the CVD method. This insulating film is etched back by anisotropic dry etching to form a side-wall spacer 106 consisting of this insulating film on the side walls of the $N^+$-type poly-crystal silicon film patterns 115a and 115b [FIG. 1(a)].

Next, an $N^+$-type diffusion layer 127 and a $P^+$-type diffusion layer 128 are formed by the ion implantation of an N-type impurity using a photoresist film (now shown) covering the region where a P-channel MOS transistor will be formed, the $N^+$-type poly-crystal silicon film pattern 115a, and the side-wall spacer 106 as masks, the ion implantation of a P-type impurity using a photoresist film (not shown) covering the region where an N-channel MOS transistor will be formed, the $N^+$-type poly-crystal silicon film pattern 115b, and the side-wall spacer 106 as masks, and heat treatment in a nitrogen atmosphere at, for example 900° C., for 20 minutes for the recovery of silicon crystals and the inactivation of impurities. The depth of junction of $N^-$-type diffusion layer 127 and a $P^-$-type diffusion layer 128 is about 0.2 μm. The naturally oxidized films on the upper surfaces of $N^+$-type poly-crystal silicon film patterns 115a and 115b, and on the surfaces of the $N^+$-type diffusion layer 127 and a $P^+$-type diffusion layer 128 are removed using dilute hydrofluoric acid. A titanium film 131 of a thickness of about 35 nm is deposited on the entire surface by spattering [FIG. 1(b)].

Next, the first rapid thermal annealing (RTA) is performed in a nitrogen atmosphere at 690° C. for 30 seconds to silicify the titanium film 131 directly contacting monocrystalline or poly-crystal silicon, and to form a titanium disilicide film 134 of a C49 structure selectively on the upper surfaces of $N^+$-type poly-crystal silicon film patterns 115a and 115b, and on the surfaces of the $N^+$-type diffusion layer 127 and a $P^+$-type diffusion layer 128. For example, the thickness of the titanium disilicide film 134 formed on the $N^+$-type diffusion layer 127 is about 50 nm. On the surface of the field oxide film 103 and the side-wall spacer 106 is formed a thin titanium-excess titanium silicide ($Ti_5Si_3$) film 133 with thickness less than 1 nm. Furthermore, the titanium silicide film 133 has a form covered by a titanium nitride film 132. Depending of the thickness of the as-formed titanium film 131 and the conditions of the first rapid thermal annealing, the surface of the titanium disilicide film 134 is covered by a titanium nitride film 132 (also, a titanium oxide film may be formed, or a titanium film which has not reacted may remain) [FIG. 1(c)]. Although the side-wall spacer 106 is formed of a silicon oxide film in this embodiment, if the side-wall spacer is formed of a silicon nitride film, the surface of the side-wall spacer is covered by the mixture of titanium-excess titanium silicide ($Ti_5Si_3$) and titanium nitride.

Next, the first wet etching using a mixed solution having the composition of $NH_4OH:H_2O_2:H_2O=1:1:5$ is performed at room temperature for 10 minutes to remove the titanium nitride film 132 (and the titanium film which has not reacted, the titanium oxide film, and the like). In this time, although the titanium silicide ($Ti_5Si_3$) film 133 and the titanium disilicide film 134 of a C49 structure are also etched, these films are not completely removed under these conditions. This is followed by the second rapid thermal annealing in a nitrogen atmosphere at 850° C. for 10 seconds to convert the titanium disilicide film 134 of a C49 structure on the upper surfaces of $N^+$-type poly-crystal silicon film patterns 115a and 115b, and on the surfaces of the $N^+$-type diffusion layer 127 and a $P^+$-type diffusion layer 128 to the titanium disilicide films 135a and 135b, and the titanium disilicide films 137 and 138 of a C54 structure (phase transition). By this the approximate form of a CMOS transistor of a self-aligned silicide structure is formed. The N-channel MOS transistor constituting this MOS transistor (of a self-aligned silicide structure) has a gate electrode 105a consisting of the $N^+$-type poly-crystal silicon film pattern 115a and the titanium disilicide film 135a, and a source/drain region 107 consisting of the $N^-$-type diffusion layer 117, the $N^+$-type diffusion layer 127, and the titanium disilicide film 137. The P-chaynel MOS transistor constituting this CMOS transistor (of a self-aligned silicide structure) has a gate electrode 105b consisting of the $N^+$-type poly-crystal silicon film pattern 115b and the titanium disilicide film 135b, and a source/drain region 108 consisting of the $P^-$-type diffusion layer 118, the $P^+$-type diffusion layer 128, and the titanium disilicide film 138 [FIG. 1(d)]. No change in the composition or no phase transition in the titanium silicide film 133 occurs due to the second rapid thermal annealing.

Next, the second wet etching is performed using the same composition of the mixed solution of ammonia water and hydrogen peroxide as in the first wet etching ($NH_4OH:H_2O_2:H_2O=1:1:5$) at room temperature for 20 minutes to remove the remaining titanium silicide film 133 selectively. By this the formation of the CMOS transistor having a self-aligned silicide structure according to this embodiment is completed [FIG. 1(e)]. Then, an interlayer insulating film is deposited, contact holes are formed, and metal wirings are formed by well-known manufacturing processes to form a semiconductor device to which this embodiment is applied.

Although, in the first embodiment, an N-type well 102 is formed on a P-type silicon substrate 101, and the poly-crystal silicon film pattern constituting the gate electrode 105b of the P-channel MOS transistor is an $N^+$-type poly-crystal silicon film pattern 115b, this embodiment is not limited to these. A twin well may be used, or an N-type silicon substrate may be used in place of the P-type silicon substrate 101. Also, the poly-crystal silicon film pattern constituting the gate electrode 105b of the P-channel MOS transistor may be a $P^+$-type poly-crystal silicon film pattern. The conditions of the first and second rapid thermal annealing are not limited to above values. Furthermore, the conditions of the first and second wet etching are not limited to above values.

Figure 2:
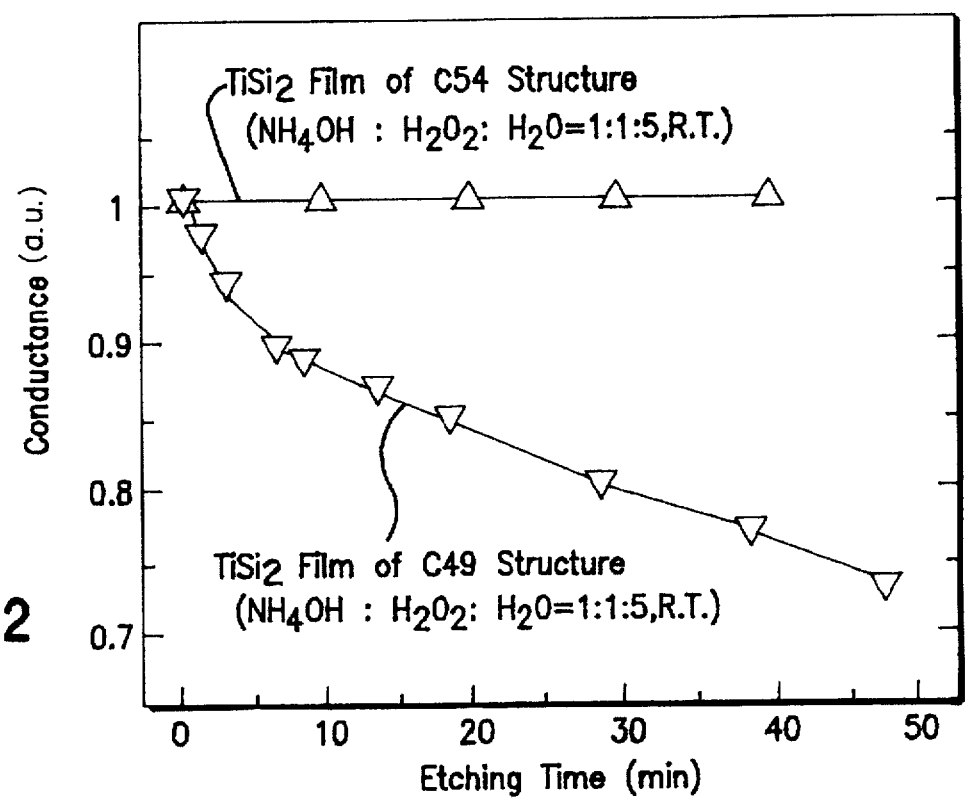
FIG. 2 is a graph showing change in conductance relative to etching time for illustrating the effect of the first embodiment.
Figure 3A:
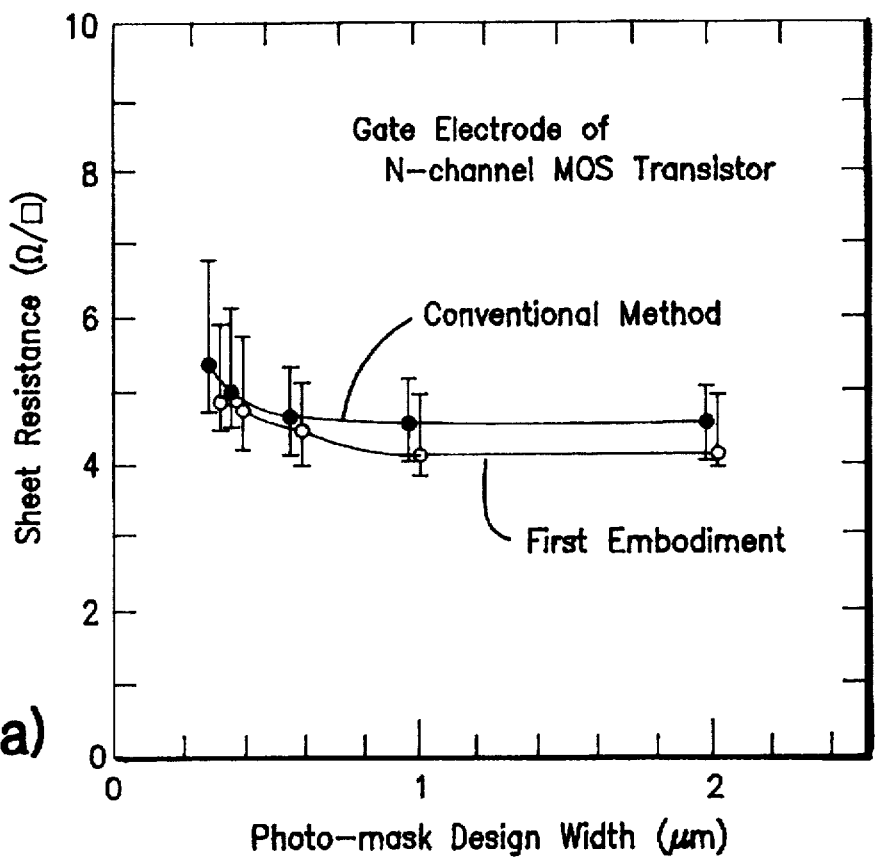
FIGS. 3(a) and 3(b) are graphs showing relationship between the design width and sheet resistance of the photo mask used for forming the gate electrode and the source/drain region for illustrating the effect of the first embodiment.
Figure 3B:
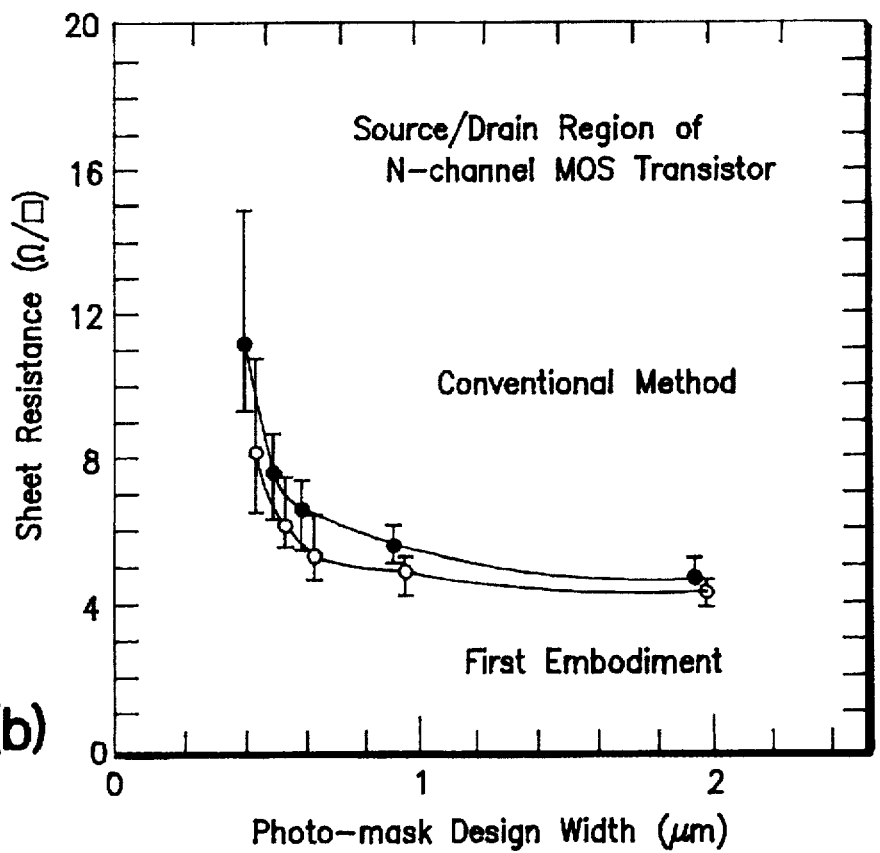
Figure 4:
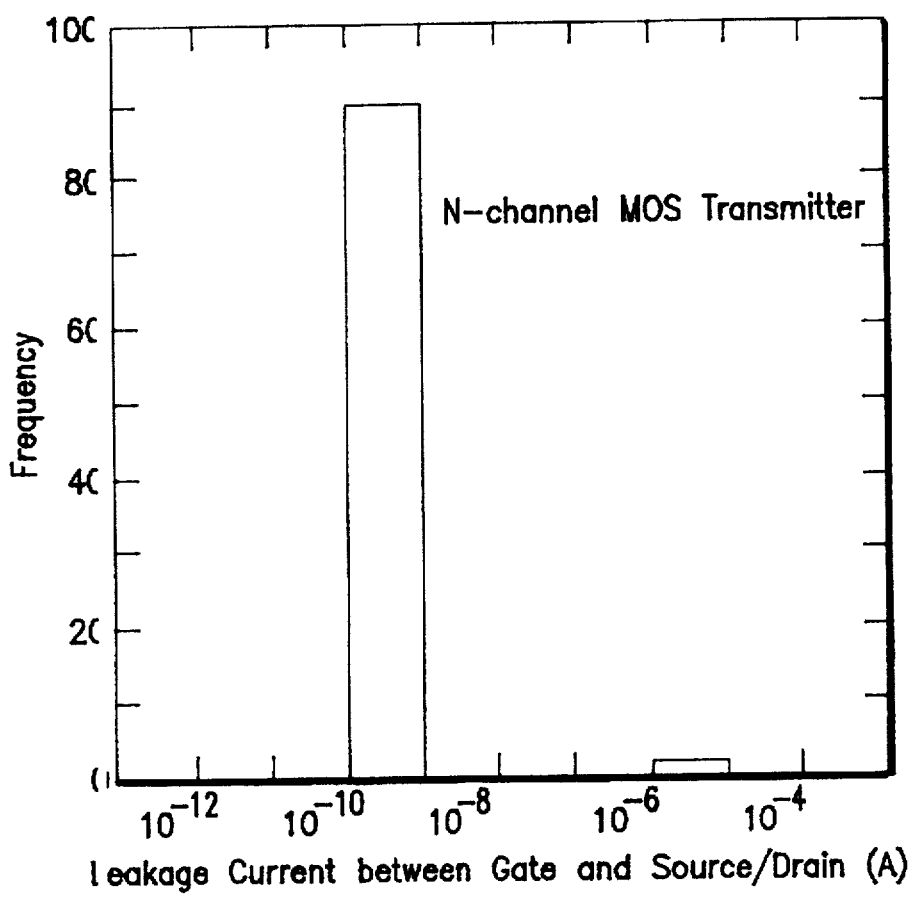
FIG. 4 is a histogram of leakage current between the gate electrode and the source/drain region for illustrating the effect of the first embodiment.

The operation of the first embodiment will be described referring to FIG. 2, a graph showing change in conductance relative to etching time, FIG. 3, a graph showing relationship between the design width and sheet resistance of the photo mask used for forming the gate electrode and the source/drain region, and FIG. 4, a histogram of leakage current between the gate electrode and the source/drain region.

The reason for the use of first and second wet etching in the first embodiment will first be described.

The titanium disilicide film having a C49 structure is etched by the mixed solution of ammonia water and hydrogen peroxide of a composition of $NH_4OH:H_2O_2:H_2O=1:1:5$. The titanium nitride film and the like formed during the first rapid thermal annealing are removed by this mixed solution in a few minutes. On the other hand, according to the results of the inventors' experiments, the titanium disilicide film having a C54 structure is only little etched by this mixed solution (FIG. 2). The above first embodiment utilizes the resistance to etching by this mixed solution of the titanium disilicide film of a C54 structure. That is, if the (thin) titanium-excess titanium silicide ($Ti_5Si_3$) film formed on the surfaces of the field oxide film and the side-wall spacer during the first rapid thermal annealing is removed after the phase transition of the titanium disilicide film of the C49 structure to the titanium disilicide film of the C54 structure by the second rapid thermal annealing, decrease in the thickness of the remaining titanium disilicide film of the C54 structure is minimized. The time of the first wet etching is determined so that the titanium nitride film (the titanium film which has not reacted, the titanium oxide film and the like) formed during the first rapid thermal annealing are completely removed. That is, the time is determined to be 10 minutes including margin. During 10 minutes of the first wet etching, the thickness of the titanium disilicide film of the C49 structure decreases by nearly 4 nm. If this time is about 3 minutes, the bridging phenomenon of the surface of the side-wall spacer becomes difficult to eliminate during the second rapid thermal annealing because of the presence of remaining titanium nitride film and the like which have not been removed completely. As described above, since the titanium silicide ($Ti_5Si_3$) film is almost completely removed in about 30 minutes of etching using the above mixed solution, the time for the second wet etching is preferably 20 minutes (30 minutes–10 minutes).

The effect of the first embodiment will now be described. When compared with the prior art method in which only the first wet etching using the above mixed solution for 20 minutes is performed, for example, the sheet resistance of the gate electrode and the sheet resistance of the source/drain region of the N-channel MOS transistor in this embodiment are lower for any photo mask design width [FIGS. 3(a), (b)]. Also, when a plurality of N-channel MOS transistors each having a gate length of 0.35 μm are connected in parallel so that the total gate width becomes 25 cm, and the leakage current between the gate electrode and the source/drain region is measured, the histogram shows that the leakage currents are distributed in the order of almost $10^{-11}$ A, and have less variation and are distributed in lower values than those of the transistor manufactured by the prior art method (FIG. 4).

According to the first embodiment, as described above, in a method for producing a MOS transistor having a self-aligned silicide structure using titanium, increase in leakage current between the gate electrode and the source/drain region, and increase in the sheet resistance of the gate electrode (and the source/drain region) can simultaneously be controlled. If the gate length, the depth of junction of diffusion layers, and the like are further reduced, the thickness of the titanium disilicide film of the C49 structure is also reduced accordingly. Therefore, this embodiment is more effective than conventional methods.

Figure 5:
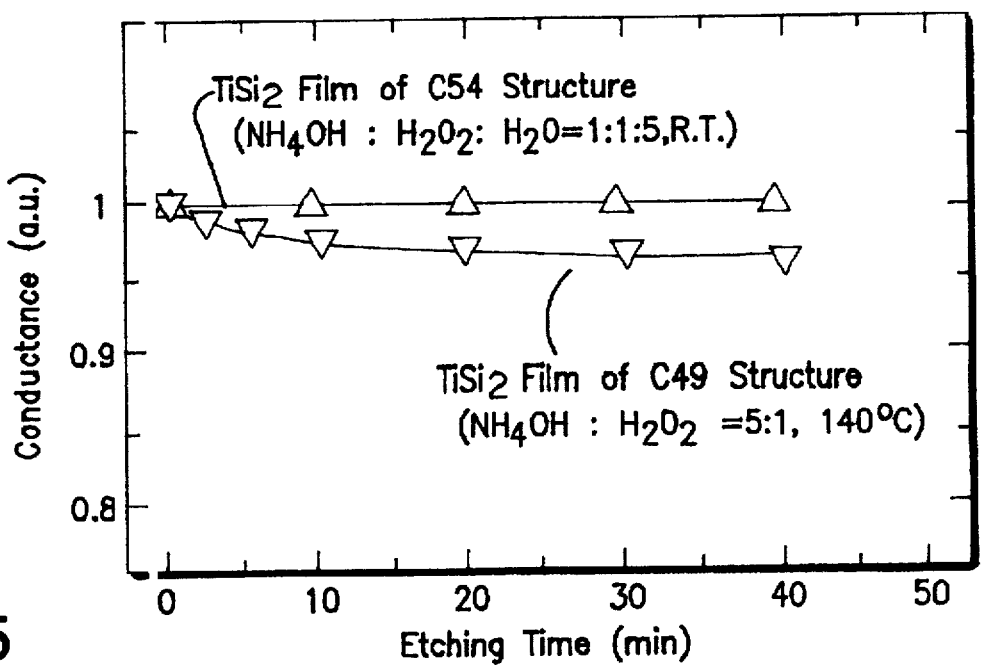
FIG. 5 is a graph showing change in conductance relative to etching time for illustrating the effect of the second embodiment of the present invention.
Figure 6A:
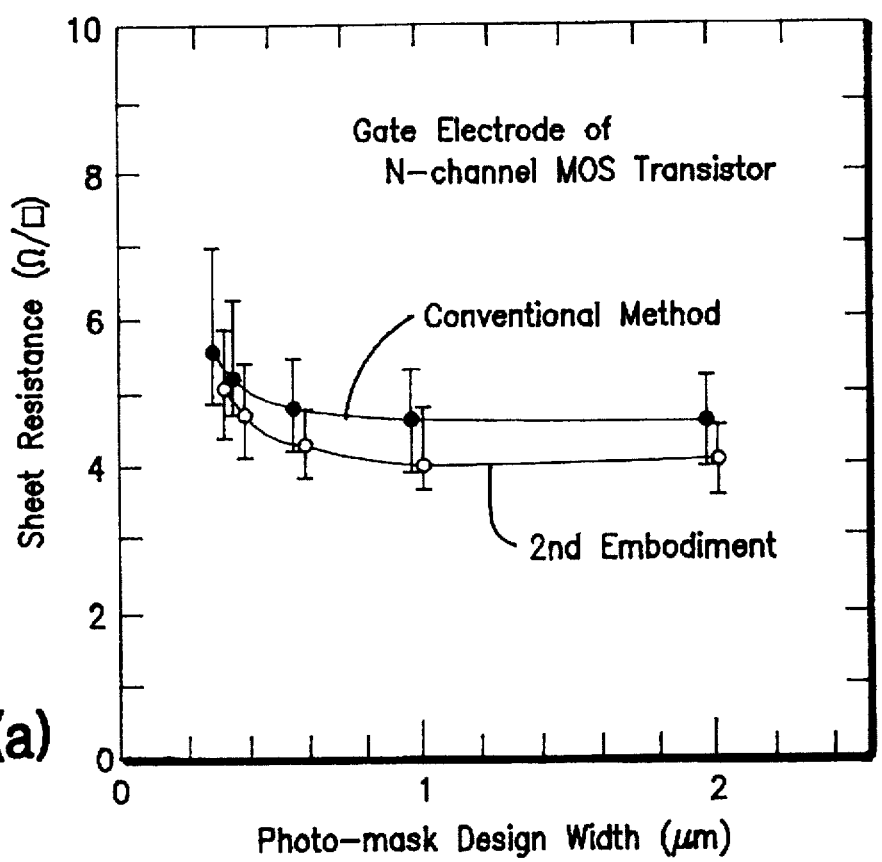
FIGS. 6(a) and 6(b) are graphs showing relationship between the design width and the sheet resistance of the photo mask used for forming the gate electrode and source/drain region for illustrating the effect of the second embodiment.
Figure 6B:
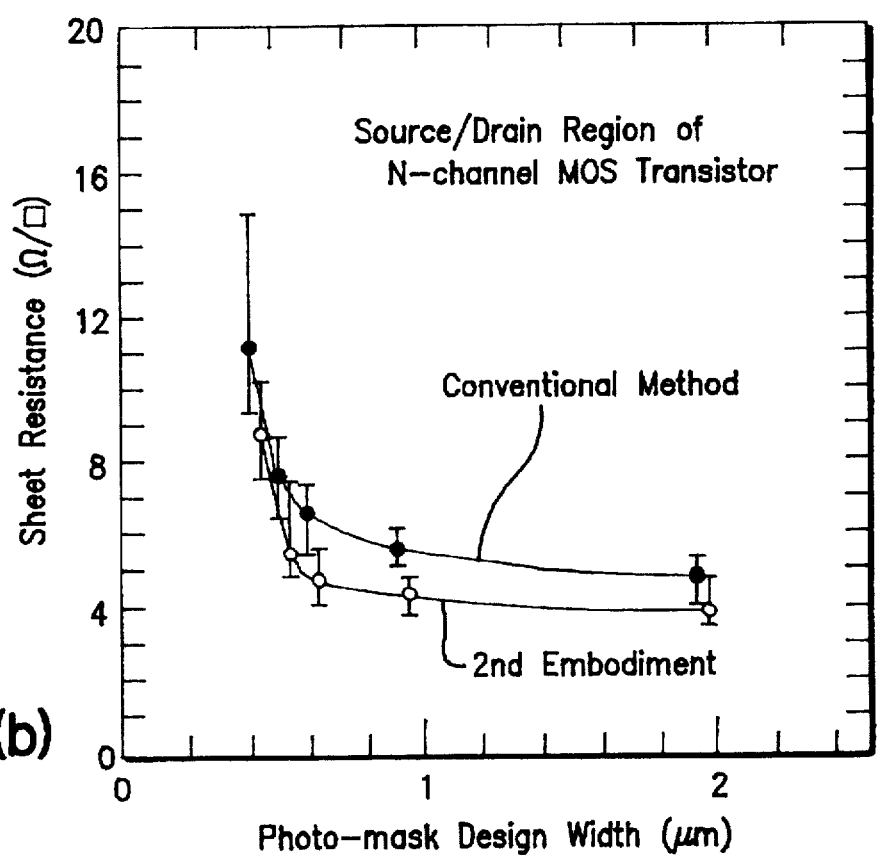
Figure 7A:
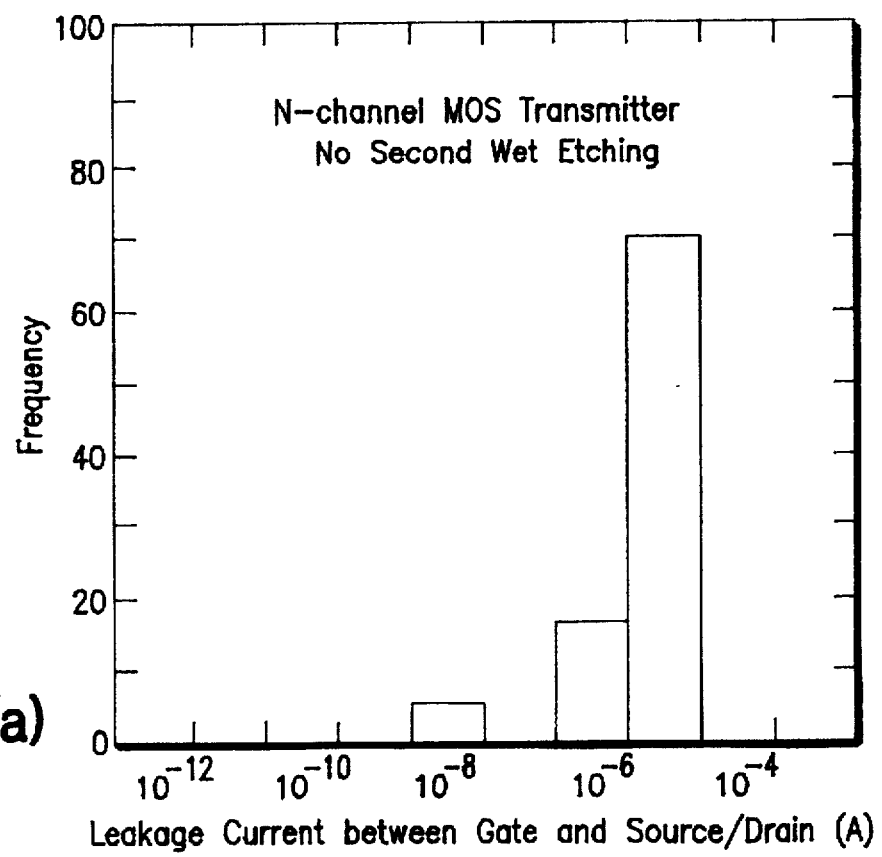
FIGS. 7(a) and 7(b) are histograms of leakage current between the gate electrode and the source/drain region for illustrating the effect of the second embodiment.
Figure 7B:
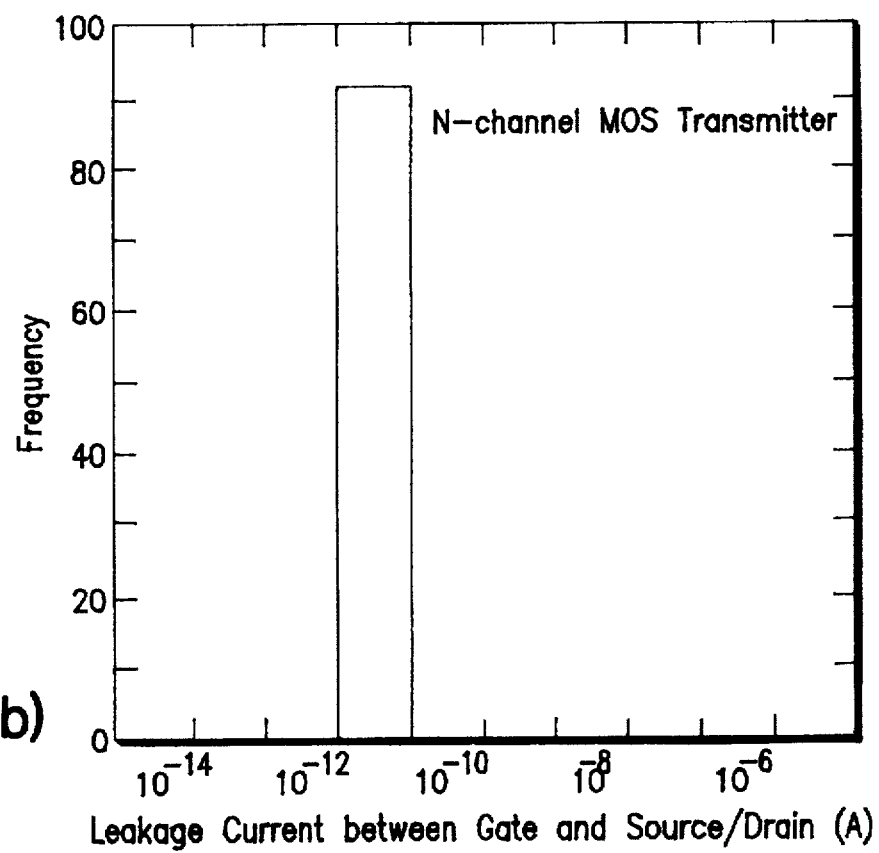
Figure 8A:
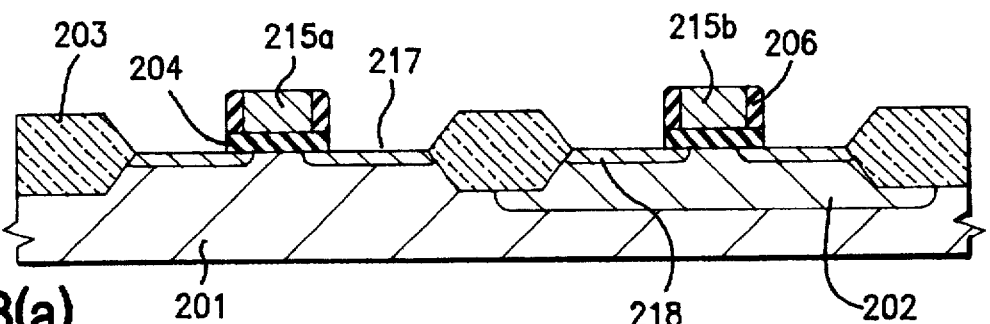
FIGS. 8(a) to 8(d) are sectional views showing steps for producing a semiconductor device for illustrating a conventional method for producing a semiconductor device.
Figure 8B:
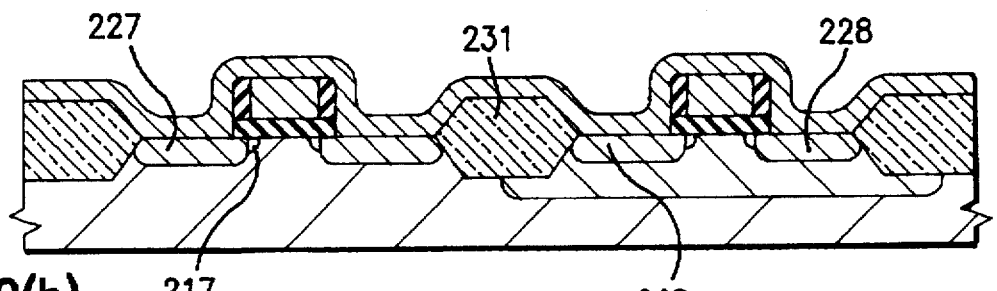
Figure 8C:
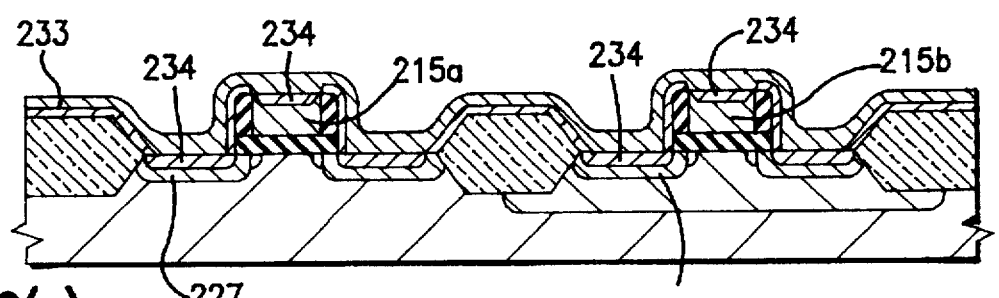
Figure 8D:
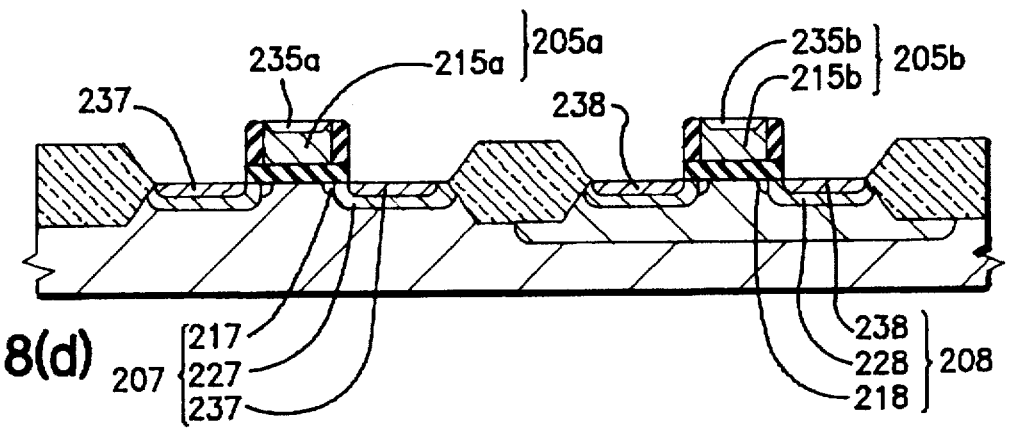

The constitution and effect of the second embodiment of the present invention will now be described referring to FIG. 5, a graph showing change in conductance relative to etching time, FIG. 6, a graph showing relationship between the design width and the sheet resistance of the photo mask used for forming the gate electrode and the source/drain region, and FIG. 7, a histogram of leakage current between the gate electrode and the source/drain region.

The difference between this embodiment and the first embodiment is that the mixed solution of ammonia water and hydrogen peroxide is not used in the first wet etching, and that the etching time of the second wet etching (using the mixed solution of ammonia water and hydrogen peroxide) is different. Although the mixed solution of ammonia water and hydrogen peroxide of a composition of $NH_4OH:H_2O_2:H_2O=1:1:5$ is used in the first wet etching in the first embodiment, this mixed solution cannot avoid etching of the titanium disilicide film of the C49 structure.

In this embodiment, the first wet etching is performed using a mixed solution of the composition of $H_2SO_4:H_2O_2=5:1$ at an etchant temperature of 140° C. for 20 minutes. The amount of the titanium disilicide film of the C49 structure etched off during the first etching by this mixed solution is extremely less than the amount of the titanium disilicide film of the C49 structure etched off during the first etching by the mixed solution of ammonia water and hydrogen peroxide (under this condition, about 1 nm of the film is etched off) (FIG. 5). During the first etching by the mixed solution of sulfuric acid and hydrogen peroxide, the titanium nitride film formed during the first rapid thermal annealing is removed in about 10 minutes. In this embodiment, therefore, the first wet etching is performed for 20 minutes including margin. Since the first wet etching is performed at 140° C., the maintenance of the composition of the mixed solution is required. During the first wet etching, the titanium-excess titanium silicide ($Ti_5Si_3$) film is only little removed. In this embodiment, therefore, the second wet etching is performed using the mixed solution having a composition of $NH_4OH:H_2O_2:H_2O=1:1:5$ at room temperature for 30 minutes.

Figure 9:
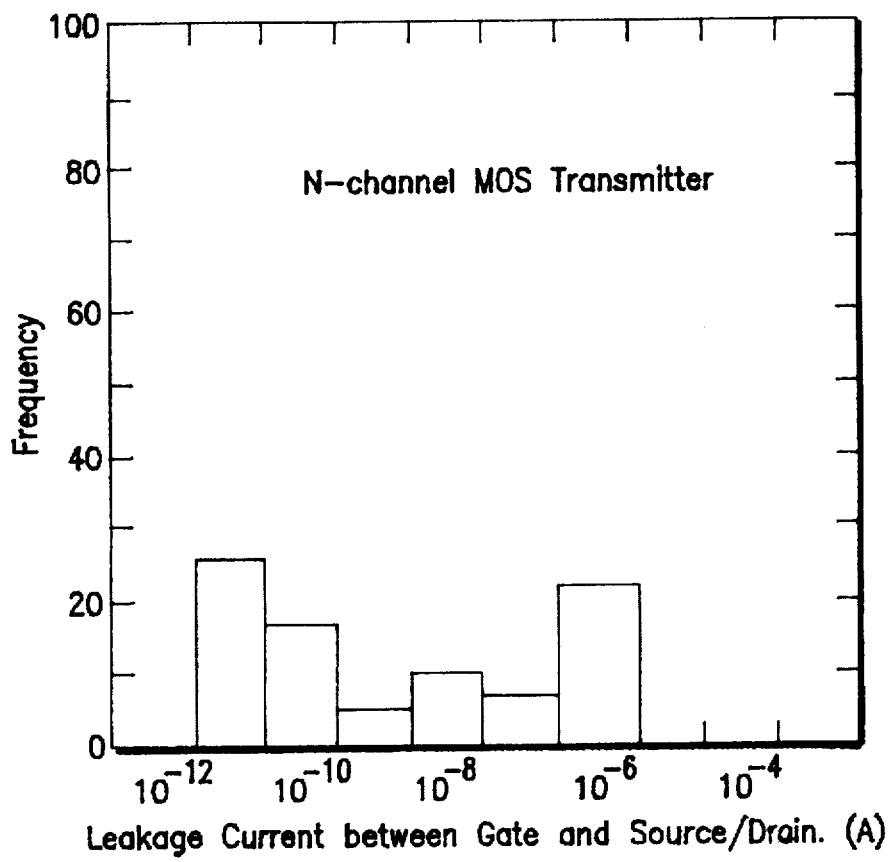
FIG. 9 is a histogram of leakage current between the gate electrode and the source/drain region for illustrating the problems in conventional semiconductor devices.

The effect of the second embodiment will now be described. When compared with the conventional method described above wherein only the first wet etching is performed for 20 minutes using the mixed solution of ammonia water and hydrogen peroxide of the above composition (without performing the second wet etching), the sheet resistance of the gate electrode and the sheet resistance of the source/drain region in the N-channel MOS transistor is lower in this embodiment for any value of the photo mask design width. Furthermore, these values are lower than the results of the first embodiment (see FIGS. 3(a) and 3(b)) [FIGS. 6(a) and 6(b)]. Also, when a plurality of N-channel MOS transistors each having a gate length of 0.35 μm are connected in parallel so that the total gate width becomes 25 cm, and the leakage current between the gate electrode and the source/drain region is measured, the histogram shows that the leakage currents are distributed in the order of almost $10^{-11}$ A as in the results of the first embodiment (see FIG. 4), and have less variation and are distributed in lower values than those of the transistor manufactured by the prior art method (see FIG. 9) [FIG. 7(b)]. In this embodiment, if the second wet etching is not performed, (as described above) since the titanium-excess titanium silicide ($Ti_5Si_3$) film is only little removed, the above leakage current will fluctuate widely at higher values [FIG. 7(a)].

According to the second embodiment, in the method for producing a MOS transistor having a self-aligned structure using titanium, the same effect as the first embodiment is obtained for controlling increase in the leakage current between the gate electrode and the source/drain region, and a larger effect than the first embodiment is obtained for controlling increase in the sheet resistance of the gate electrode (and the source/drain region).

Although a mixed solution of sulfuric acid and hydrogen peroxide is used for the first wet etching, a mixed solution of hydrochloric acid and hydrogen peroxide, a mixed solution of nitric acid and hydrogen peroxide, or a mixed solution of phosphoric acid and hydrogen peroxide may be used. These solutions have the similar effects as this embodiment.

The method for producing a semiconductor device according to the present invention is a method for producing a MOS transistor having a self-aligned silicide structure using titanium, wherein poly-crystal silicon film patterns of a high concentration and of a desired conductivity type in the region where the gate electrode will be formed, a side-wall spacer consisting of an insulating film is formed on the side wall of these poly-crystal silicon film patterns, a diffusion layer of a high concentration self-aligned to the side-wall spacer in the region where the source/drain region will be formed, a titanium film is deposited, then a titanium disilicide film of a C49 structure is selectively formed on the upper surface of the poly-crystal silicon film patterns and the surface of the diffusion layers by the first rapid thermal annealing in a nitrogen atmosphere, and the titanium nitride film is selectively removed by the first wet etching. Furthermore, the titanium disilicide film of the C49 structure is converted to the titanium disilicide film of the C54 structure by the second rapid thermal annealing, and the titanium-excess titanium silicide film formed on the surface of insulating films such as the side-wall spacer is selectively removed by the second wet etching. By this decrease in the thickness of the titanium disilicide film of the C49 structure can be minimized by the first wet etching, and the titanium-excess titanium silicide film is completely removed by the second wet etching. As the result, increase in the leakage current between the gate electrode and the source/drain region, and increase in the sheet resistance of the gate electrode (and the source/drain region) can simultaneously be controlled.

What is claimed is:

1. A method for producing a semiconductor device comprising the steps of: forming a field oxide film in an element separating region on the surface of a silicon substrate having a region of one conductivity type; forming a gate oxide film in an element forming region on the surface of said silicon substrate; forming a poly-crystal silicon film pattern in a region on the surface of said silicon substrate where a gate electrode is formed; forming a side-wall spacer consisting of an insulating film on the side wall of said poly-crystal silicon film pattern; forming a diffusion layer of an opposite conductivity type and self-aligned with said side-wall spacer on the surface of said region of one conductivity type; forming a titanium film over the surface of said field oxide film, said poly-crustal silicon film pattern, said diffusion layer, and said sidewall spacer; forming a titanium disilicide film of the C49 structure selectively on an upper surface of said poly-crystal silicon pattern and a surface of said diffusion layer of the opposite conductivity type by a first rapid thermal annealing in a nitrogen atmosphere; removing a titanium nitride film by a first wet etching; converting said titanium disilicide film of the C49 structure to a titanium disilicide film of the C54 structure by a second rapid thermal annealing; and selectively removing a titanium silicide film formed on the surface of said field oxide film and the surface of said side-wall spacer by a second wet etching after said converting step.

2. The method as claimed in claim 1, wherein said first wet etching is performed by a mixed solution of sulfuric acid and hydrogen peroxide to selectively remove said titanium nitride film.

3. The method as claimed in claim 1, wherein said second wet etching is performed by a mixed solution of ammonia water and hydrogen peroxide.

4. The method of claim 3, wherein the mixed solution of the second wet etching has an $NH_4OH:H_2O_2:H_2O$ ratio of 1:1:5.

5. The method of claim 3, wherein the first wet etching is performed using a mixed solution of ammonia water and hydrogen peroxide to selectively remove said titanium nitride film.

6. The method of claim 5, wherein the second wet etching is performed for 20 minutes.

7. The method of claim 5, wherein the second wet etching is performed at room temperature.

8. The method of claim 5, wherein the first wet etching is performed for 3–10 minutes.

9. The method of claim 5, wherein the mixed solution of the first wet etching has an $NH_4OH:H_2O_2:H_2O$ ratio of 1:1:5.

10. The method of claim 3, wherein the first wet etching is performed using a mixed solution of sulfuric acid and hydrogen peroxide to selectively remove said titanium nitride film.

11. The method of claim 10, wherein the second wet etching is performed for 30 minutes.

12. The method of claim 10, wherein the first wet etching is performed at 140° C.

13. The method of claim 10, wherein the first wet etching is performed for 10–20 minutes.

14. The method of claim 10, wherein the mixed solution of the first wet etching has an $H_2SO_4:H_2O_2$ ratio of 5:1.

15. The method of claim 3, wherein the first wet etching is performed using a mixed solution of hydrochloric acid and hydrogen peroxide to selectively remove said titanium nitride film.

16. The method of claim 3, wherein the first wet etching is performed using a mixed solution of nitric acid and hydrogen peroxide to selectively remove said titanium nitride film.

17. The method of claim 3, wherein the first wet etching is performed using a mixed solution of phosphoric acid and hydrogen peroxide to selectively remove said titanium nitride film.

18. The method of claim 1, wherein the first rapid thermal annealing is performed at 690° C.

19. The method of claim 1, wherein the first rapid thermal annealing is performed for approximately 30 seconds.

20. The method of claim 1, wherein the second rapid thermal annealing is performed at approximately 850° C.

21. The method of claim 1, wherein the second rapid thermal annealing is performed for approximately 10 seconds.

* * * * *